United States Patent [19]

Wascom

[11] Patent Number: 4,805,729

[45] Date of Patent: Feb. 21, 1989

[54] SPEAKER ENCLOSURE

[76] Inventor: Bart A. Wascom, 25671 LA Hwy., 16, Denham Springs, La. 70726

[21] Appl. No.: 73,179

[22] Filed: Jul. 14, 1987

[51] Int. Cl.[4] .................................................. H05K 5/00

[52] U.S. Cl. .................................... 181/144; 181/148; 181/153; 181/156; 181/199

[58] Field of Search ............... 181/144, 148, 153, 155, 181/156, 199, 150

[56] References Cited

U.S. PATENT DOCUMENTS

| | | | |
|---|---|---|---|
| D. 71,138 | 3/1926 | Dietrich . | |
| D. 74,170 | 2/1928 | Colburn . | |
| D. 188,326 | 7/1960 | Levy et al. . | |
| D. 228,920 | 10/1973 | Iida . | |
| D. 230,997 | 3/1974 | Shannon . | |
| D. 270,444 | 9/1983 | Matsuda et al. | D14/33 |
| D. 276,806 | 12/1984 | Eberbach | D14/30 |
| 2,096,192 | 10/1937 | Moore . | |
| 2,491,982 | 12/1949 | Kincart | 181/156 |
| 2,881,850 | 4/1959 | Bonn . | |
| 3,023,830 | 3/1962 | Hammes . | |
| 3,026,955 | 3/1962 | Wilber | 181/153 |
| 3,203,502 | 8/1965 | Rife | 181/156 |
| 4,057,689 | 11/1977 | Stallings, Jr. | 181/153 X |
| 4,082,159 | 4/1978 | Petty | 181/199 X |
| 4,128,738 | 12/1978 | Gallery | 181/156 X |
| 4,161,230 | 7/1979 | Ripple | 181/150 X |
| 4,169,516 | 10/1979 | Honda | 181/153 |

*Primary Examiner*—B. R. Fuller

*Attorney, Agent, or Firm*—Karen M. Gerken; Martin P. Hoffman; Mitchell B. Wasson

[57] ABSTRACT

A speaker enclosure characterized by a curved back wall and top and bottom planar surface members which together define a front opening. A speaker member, a horn member and a tweeter member are adapted to be mounted within the front opening. At least the curved back wall is made from wood of a specified range of thicknesses and of a particular range of radii of curvature to achieve increased power output for the speaker and enhanced quality of sound.

7 Claims, 2 Drawing Sheets

FIG. 5.
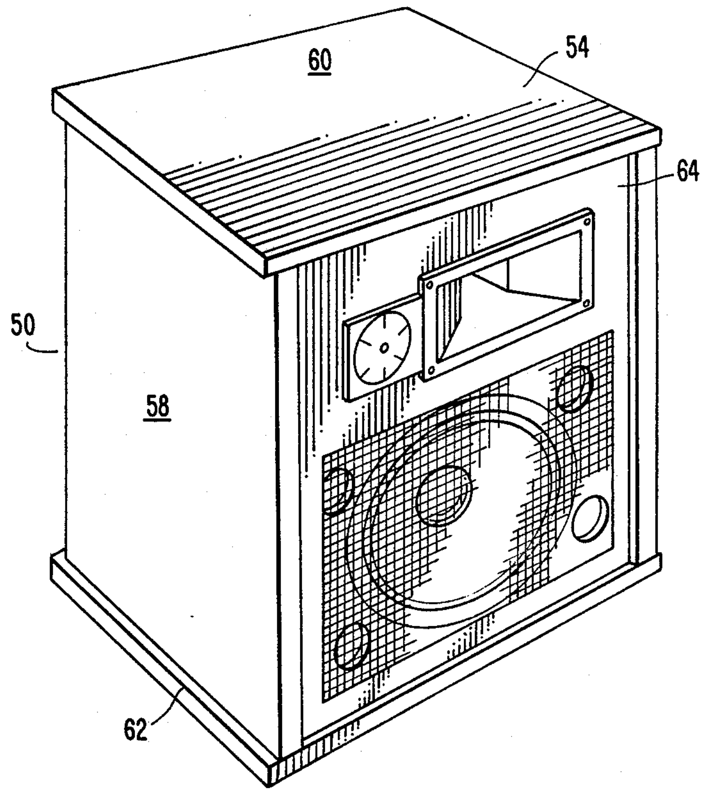
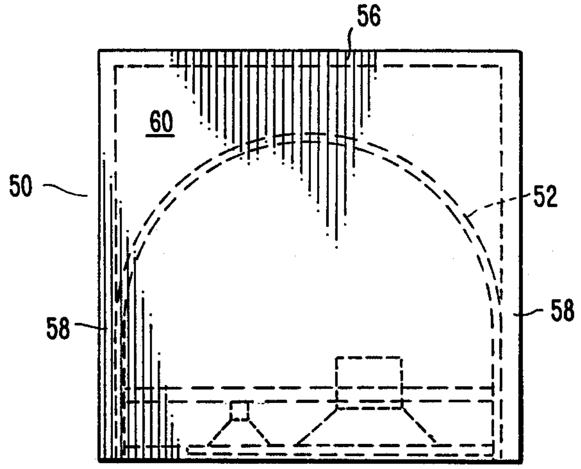
FIG. 6.

SPEAKER ENCLOSURE

BACKGROUND OF THE INVENTION

1. Field of the Invention

The invention pertains generally to speaker enclosures for loudspeakers and the like. More particularly, the invention relates to an enclosure which is adapted to have mounted therein a speaker, a horn and a tweeter, or like components, and which is uniquely configured so as to substantially increase the power level obtained with the speaker, as well as to dramatically improve the quality of sound produced by the speaker.

The subject invention achieves the foregoing objectives by providing a uniquely and particularly shaped speaker enclosure, made from wood, that is able to produce more power and better tone. In contrast to other known speaker enclosures, wherein the quality of sound noticeably deteriorates as higher power outputs are attained, the instant invention has proven to be able to realize unparalleled power levels, not only without a reduction in sound quality, but actually with a clearly perceptible improvement in the overall tone for all volume and decibel ranges.

The enclosure of the present invention is provided with a curved back surface having a radius of curvature which allows the back surface to amplify and reflect the sound waves projected thereon. Moreover, the radius of curvature of the back surface, in conjunction with the thin wood sheet from which the back surface is fabricated, causes resonance of the sound waves so as to intensify and clarify the resulting tone.

2. Description of the Prior Art

It is known in the prior art to provide a speaker cabinet that defines a cylindrical enclosure. For example, U.S. Pat. No. 4,169,516 to Honda teaches a cylindrical enclosure within which is mounted a speaker disposed in a rectangular accommodation box. The speaker is designed such that sound waves are adapted to be reflected and canceled to prevent resonance.

U.S. Pat. No. 4,057,689 to Stallings, Jr, discloses sound modules including a spherical shell of plastic or glass.

U.S. Pat. No. 3,026,955 to Wilber shows a loudspeaker enclosure comprising a spherical shell formed of rigid hemispherical halves being provided with a sound absorbing lining.

U.S. Design Pat. No. 276,806 shows a design for a loudspeaker cabinet that is generally cylindrical in shape, being characterized by two intersecting planar front walls. U.S. Design Pat. No. 228,920 to Iida and U.S. Design Pat. No. 270,444 to Matsuda et al also disclose speaker cabinet designs utilizing a curved surface.

The prior art fails to disclose a speaker cabinet enclosure made from wood and having a planar front surface for mounting the appropriate speaker components and a thin curved back wall. The prior art fails to teach or suggest a speaker enclosure wherein the curved back wall is adapted to resonate and to reflect sound, there being no sound absorbing means provided in order to prevent resonation. Unlike prior art devices, the subject invention appears to achieve increased power output and enhanced sound quality by resonation of the back wall in conjunction with the reflection of sound therefrom.

SUMMARY OF THE INVENTION

The invention relates to a speaker enclosure being defined by a curved back wall, a planar top surface member and a planar bottom surface member. At least the curved back wall, and preferably the entire enclosure, is made from wood. The curved wall and the top and bottom surface members together define a front opening. The front opening is adapted to have mounted therein, on a mounting plate or by other suitable means, a speaker member, a horn member and a tweeter member or the like.

The curved back wall is adapted to assume a range of wall thicknesses and radii of curvature. The radius of curvature of the back wall, together with the wall thickness, causes resonation of the curved wall and reflection of sound waves therefrom so as to produce a higher decibel level for the speaker and better quality sound. The vertical height of the curved wall is also restricted to the particular range over which the latter results are obtained.

Alternatively, the curved back wall may be in the nature of a curved baffle member, disposed within a generally rectangular outer enclosure which affords protection for the thin curved wall.

BRIEF DESCRIPTION OF THE DRAWINGS

FIG. 5 is a first alternative embodiment of the speaker enclosure of the present invention showing the speaker components mounted therein; and FIG. 6 is a top plan view of the speaker enclosure of FIG. 5.

DESCRIPTION OF THE PREFERRED EMBODIMENT

Figure 3:
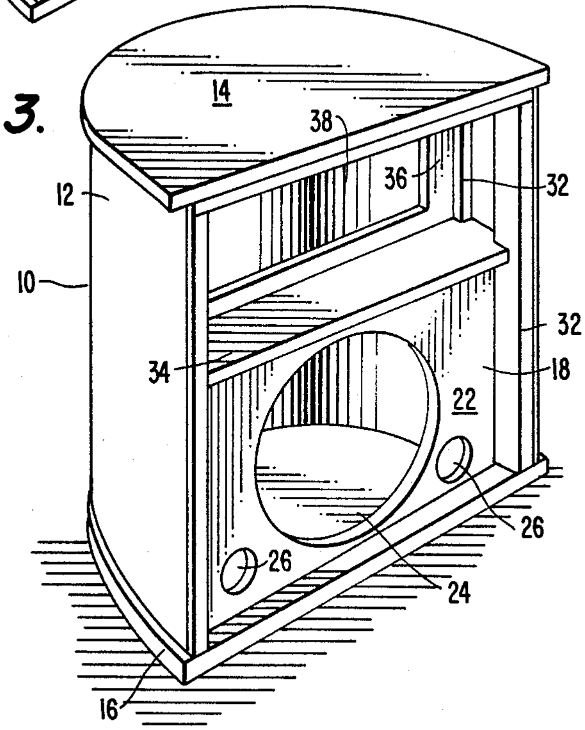
FIG. 3 is a perspective view of the speaker enclosure of the present invention as it appears prior to the mounting of the speaker components therein.

The present invention can best be described in connection with the preferred embodiment depicted in FIGS. 1–4. As best illustrated in FIG. 3, the speaker enclosure 10 comprises a curved back wall 12, a planar top surface member 14 and a planar bottom surface member 16. The speaker enclosure is adapted to rest upon a support surface, such as the floor, by means of its bottom surface 16 resting thereon as shown in FIG. 3. The curved back wall and the top and bottom surface members together define a generally rectangular front opening 18.

The curved back wall and the top and bottom surfaces are all formed of wood. The radius of curvature of the back wall for which it is possible to obtain the advantageous result of enhanced sound quality and increased power ranges from a minimum radius of curvature of 6 inches to a maximum radius of curvature of 15 inches. The wall thickness of the curved back wall with which the desired results are attained ranges from a minimum wall thickness of $\frac{1}{8}$ inch to a maximum wall thickness of $\frac{1}{4}$ inch. Moreover, the overall dimensions of the speaker enclosure affect the power output and sound quality realized. It has been determined that the minimum vertical height for the curved wall 12 should be around 16 inches, with the maximum vertical height preferably being around 36 inches. It is also desirable that the thickness of the top and bottom planar surface members 14 and 16 be approximately $\frac{3}{4}$ of an inch.

Figure 4:
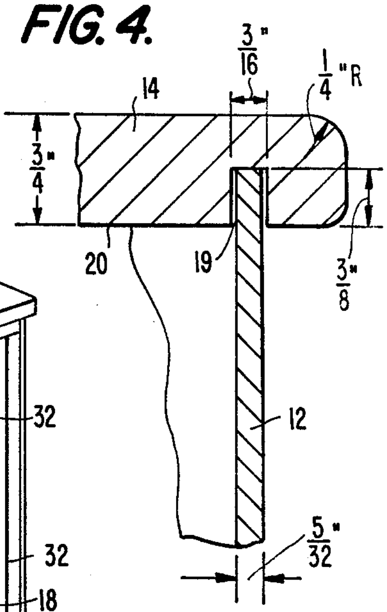
FIG. 4 is a sectional view taken along line 4—4 of FIG. 2.

FIG. 4 most clearly illustrates the curved wall 12 as it appears when assembled to the planar top surface 14. As can be seen therein, the curved wall is 5/32 of an inch thick. The upper edge of this wall fits within a peripheral slot 19, 3/16 of an inch wide and $\frac{3}{8}$ of an inch deep, that is provided in the bottom surface 20 of the top surface member 14 along its periphery. The external edges of the top surface are rounded to a radius of $\frac{1}{4}$ inch. The bottom surface member 16 is adapted to cooperate with the lower edge of the curved wall in a similar manner.

Figure 1:
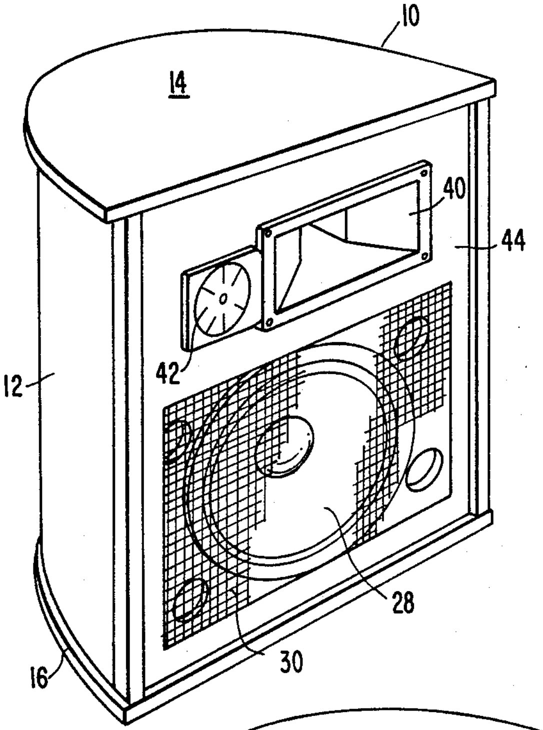
FIG. 1 is a perspective view of the speaker enclosure of the present invention showing the speaker components mounted therein.
Figure 2:
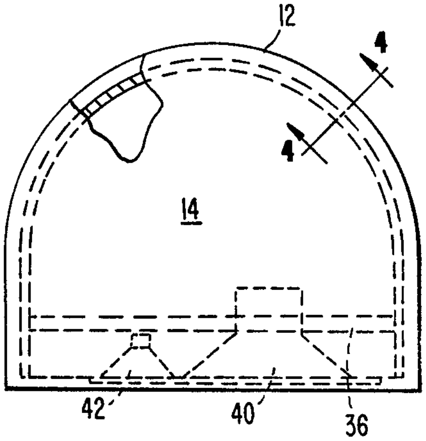
FIG. 2 is a top plan view of the speaker enclosure of FIG. 1 showing the top surface member partly broken away.

With particular reference to FIG. 3, the front opening 18 of the enclosure has mounted therein a vertical mounting plate 22. The vertical mounting plate is provided with a generally circular central opening 24. Additionally, the mounting plate is provided with a plurality of smaller vent openings 26. The circular opening 24 is adapted to have mounted therein a speaker member 28 as shown in FIG. 1. The speaker may be mounted on the mounting plate by any suitable means and may be covered with a protective screen 30 made from fabric or the like. Similarly, the mounting plate may be retained in position within the opening by any suitable means, being shown in FIG. 3 as being retained between a pair of vertical retaining members 32 which project inwardly from the inner surface of the curved wall.

A shelf-like member 34 is mounted above the mounting plate, being retained by means of retaining members 32. A second vertical mounting plate 36 is disposed above the shelf member 34. A generally rectangular opening 38 is formed in the second mounting plate. The opening 38 is adapted to have mounted therein additional speaker components, such as the horn 40 and tweeter 42 shown in FIG. 1. As further shown in FIG. 1, the front opening of the speaker enclosure, when the speaker, horn and tweeter are assembled thereto, is covered with a cover plate 44 provided with appropriate openings for the various speaker components.

It is apparent that the speaker components may be mounted in the front opening by diverse means, not being limited to that described herein. It is, however, desirable that the arrangement of components be as disclosed.

A first alternative embodiment for the speaker enclosure is illustrated in FIGS. 5 and 6. The speaker enclosure 50 shown in FIGS. 5 and 6 is basically the same as that described in connection with the preferred embodiment, but including a curved back wall 52 in the nature of a baffle. The curved wall cooperates with a mounting plate as previously described for mounting the speaker and other auxiliary components. The curved baffle is enclosed within a generally rectangular secondary enclosure 54 defined by a back wall 56, a pair of side walls 58, a top surface member 60 and a bottom surface member 62. A cover plate 64 is provided over the front opening as was discussed in connection with FIG. 1.

Actual laboratory comparison testing of the speaker enclosure has shown that, by controlling the thickness and radius of curvature of the curved back wall, and by maintaining the height of the enclosure within a certain range, it is possible to realize a 30% increase in the power or decibel level obtained with a particular speaker mounted in the present enclosure than with the same speaker mounted in a widely popular prior art speaker cabinet. It has also been shown that the present enclosure is unanimously preferred by listeners as possessing the most desirable quality of sound and tone over all decibel levels.

The foregoing qualities appear to be realized with the subject invention through the particular radius of curvature and wall thickness adapted for the back curved wall and the height range identified for the enclosure. The curved back wall, made from wood, in combination with the overall dimensions of the enclosure appears to reflect sound emanating from the speaker and to resonate in such a manner as to enhance the sound level and quality.

While the invention has been described in connection with a preferred embodiment, the foregoing description is made by way of example only, it being apparent that obvious modifications to the details of the invention may be made without departing from the spirit and scope of the invention.

I claim:

1. A speaker enclosure for a speaker member, a horn member, a tweeter member and the like comprising a curved back wall having a thickness and a vertical height, a planar top surface, a planar bottom surface and a generally rectangular front opening, a mounting plate adapted to be retained within said front opening for mounting said speaker member thereon, said horn member and said tweeter member being adapted to be mounted in said front opening above said speaker member, at least said curved back wall being made out of wood, said radius of curvature of said curved wall being in a range of 6 inches to 15 inches, said thickness of said back wall being in a range of $\frac{1}{8}$ inch to $\frac{1}{4}$ inch, said vertical height of said back wall being in a range of 16 inches to 36 inches.

2. The speaker enclosure recited in claim 1 further comprising at least one vent opening formed in said mounting plate.

3. The speaker enclosure recited in claim 1 further comprising a cover plate adapted to cover said front opening after said speaker member, said horn member and said tweeter member have been mounted therein.

4. The speaker enclosure recited in claim 1 wherein said top and bottom surfaces are around $\frac{3}{4}$ of an inch in thickness.

5. The speaker enclosure recited in claim 4 wherein an upper edge of said curved wall is adapted to be disposed within a recess formed in said top surface, and a lower edge of said curved wall is adapted to be disposed within a recess formed in said bottom surface.

6. The speaker enclosure recited in claim 1 further comprising a second back wall and a pair of side walls, said second back wall and said side walls being straight, said second back wall and said side walls surrounding said curved back wall so as to form, together with said front opening, a generally rectangular configuration.

7. A speaker enclosure for a speaker member, a horn member, a tweeter member and the like, comprising a curved back wall member formed of wood and being $\frac{1}{8}$ inch to $\frac{1}{4}$ inch thick and being 16 inches to 36 inches high, said back wall having an upper edge and a lower edge, a planar top member having a peripheral recess adapted to receive said upper edge, a planar bottom member having a second peripheral recess adapted to receive said lower edge, said curved wall member and said top and bottom members defining a generally rectangular front opening adapted to have mounted therein said speaker member, said horn member and said tweeter member and the like.

* * * * *